(12) United States Patent
Roh

(10) Patent No.: US 7,750,456 B2
(45) Date of Patent: Jul. 6, 2010

(54) PRINTED CIRCUIT BOARD AND METHOD OF MANUFACTURING SEMICONDUCTOR PACKAGE USING THE SAME

(75) Inventor: Hyoung-ho Roh, Yongin-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 521 days.

(21) Appl. No.: 11/651,670

(22) Filed: Jan. 10, 2007

(65) Prior Publication Data
US 2007/0160817 A1  Jul. 12, 2007

(30) Foreign Application Priority Data
Jan. 11, 2006  (KR) ............... 10-2006-0003109

(51) Int. Cl.
*H01L 23/06* (2006.01)
(52) U.S. Cl. ............ 257/687; 257/673; 257/676; 257/684; 174/255
(58) Field of Classification Search ............ 428/209; 257/673, 676, 684, 687; 174/258, 255
See application file for complete search history.

(56) References Cited
U.S. PATENT DOCUMENTS

| | | | | |
|---|---|---|---|---|
| 6,048,755 A | * | 4/2000 | Jiang et al. | 438/118 |
| 6,174,562 B1 | * | 1/2001 | Bergstedt | 430/314 |
| 6,391,681 B1 | * | 5/2002 | Corisis | 438/106 |
| 6,392,291 B1 | * | 5/2002 | Corisis | 257/678 |
| 6,617,021 B2 | * | 9/2003 | Kobayashi et al. | 428/355 EP |
| 6,668,449 B2 | * | 12/2003 | Rumsey et al. | 29/840 |
| 6,849,805 B2 | * | 2/2005 | Honda et al. | 174/250 |
| 6,984,545 B2 | * | 1/2006 | Grigg et al. | 438/118 |
| 7,023,097 B2 | * | 4/2006 | Thomas et al. | 257/780 |
| 7,078,823 B2 | | 7/2006 | Thurgood | |
| 7,102,217 B2 | * | 9/2006 | Thurgood | 257/673 |
| 7,125,748 B2 | * | 10/2006 | Grigg et al. | 438/118 |
| 7,138,724 B2 | * | 11/2006 | Grigg et al. | 257/782 |
| 7,146,720 B2 | * | 12/2006 | Rumsey et al. | 29/840 |

FOREIGN PATENT DOCUMENTS

| | | |
|---|---|---|
| JP | 2001-015647 A | 1/2001 |
| KR | 1998-073215 A | 11/1998 |
| KR | 2004-0079500 A | 9/2004 |
| KR | 2004-0080627 A | 9/2004 |

* cited by examiner

*Primary Examiner*—Cathy Lam
(74) *Attorney, Agent, or Firm*—Drinker Biddle & Reath LLP

(57) ABSTRACT

Provided is a printed circuit board having a structure that can prevent the generation of cracks around a rectangular hole and a method of manufacturing a printed circuit board for a semiconductor package. The printed circuit board includes a base substrate in which at least one window slit is formed, a plurality of circuit patterns formed at least on a side surface of the base substrate, a protective layer formed on the base substrate and the circuit patterns, and a crack preventive layer that is formed along at least a portion of edges of the window slit and is not formed at least on the circuit patterns.

6 Claims, 8 Drawing Sheets

PRINTED CIRCUIT BOARD AND METHOD OF MANUFACTURING SEMICONDUCTOR PACKAGE USING THE SAME

CROSS-REFERENCE TO RELATED PATENT APPLICATION

This application claims the benefit of Korean Patent Application No. 10-2006-0003109, filed on Jan. 11, 2006, in the Korean Intellectual Property Office, the disclosure of which is incorporated herein in its entirety by reference.

BACKGROUND OF THE INVENTION

1. Field of the Invention

The present invention generally relates to a printed circuit board and a method of manufacturing a printed circuit board for a semiconductor package. More particularly, the present invention relates to a printed circuit board having a structure that can prevent the generation of cracks around a window slit when the window slit is formed in a base substrate.

2. Description of the Related Art

Semiconductor packages having a board on chip (BOC) structure are being used more frequently as the operation speed of memory semiconductors increases. In the BOC structure, a semiconductor chip is directly mounted on a printed circuit board whereas in conventional semiconductor packages electrical signals are transmitted between an integrated circuit (IC) and a circuit on substrate through a lead frame of a packaged semiconductor. The BOC structure has an advantage in that thermal and electrical problems caused by the high speed of a DRAM of semiconductor devices can be effectively handled.

FIG. 1 is a cross-sectional view illustrating an example semiconductor package having a BOC structure. The BOC structure package uses a printed circuit board 10 having a window slit 15 formed in the center thereof. A semiconductor chip 20 is bonded on an upper surface of the printed circuit board 10 using an adhesive 30. The chip 20 is configured on the board 10 such that an electrode unit 23 of the chip 20 is oriented in an inner space of the window slit 15 of the printed circuit board 10.

The printed circuit board 10 includes a base substrate 11, a circuit pattern 12 formed at least on a side of the base substrate 11, and a protective layer 13 that protects the circuit pattern 12. A conductive ball 14 that is configured for electrical connection to an external substrate (not shown) is formed in a void or gap of the protective layer 13 such that the ball 14 contacts the circuit pattern 12.

In this case, the electrode unit 23 of the semiconductor chip and the circuit pattern 12 of the printed circuit board 10 are electrically connected by a wire 33. Thus, the wire 33 passes through the window slit 15. A region where the wire 33, the electrode unit 23, and the circuit pattern 12 are included may be molded by a molding material 40 to protect the wire 33 from being damaged or accidentally disconnected.

The printed circuit board 10 for the BOC may be manufactured in the form of a strip, sheet or tape. The printed circuit board 10 may be formed by sintering a resin pressed by a glass fiber matrix. Usually, the window slit 15 is formed in the printed circuit board 10 by using a drill, for example after stacking a plurality of sheet shaped printed circuit boards.

In this case, to accurately set the position of the window slit 15, a hole having a predetermined size is first formed through a laser processing. Afterward, the window slit 15 is formed using a drill. Accordingly, formation of the window slit 15 is a two step process that thereby increases manufacturing time and costs.

Recently, the printed circuit board 10 can be formed more efficiently by a reel-to-reel (roll-to-roll) process. However, when a drill is used to form the window slit 15, the manufacturing time is further increased.

To reduce the hole forming time and manufacturing costs, a punching process can be used. However, when pressure is applied to the printed circuit board 10 to perforate the window slit 15, cracks can be generated at the cutting surface since the printed circuit board 10 includes glass fiber. The cracks can degrade the appearance of the printed circuit board 10 and affect circuit patterns.

SUMMARY OF THE INVENTION

According to an aspect of the present invention, there is provided a printed circuit board comprising: a base substrate including a first surface and a second surface; at least one window slit in the base substrate, the slit having a perimeter; a plurality of circuit patterns on at least one of the first and second surfaces of the base substrate; a protective layer on the plurality of circuit patterns; and a crack preventive member along at least a portion of the perimeter, the crack preventive member being separated from the plurality of circuit patterns.

The crack preventive layer may be formed of the material for the protective layer and/or the material for the circuit pattern.

The window slit may be formed by a punching process.

The base substrate may be formed of FR-4 or BT, and the base substrate may be provided by a reel-to-reel method.

In one embodiment the crack preventive layer may be formed of the same material as the protective layer so that the crack preventive layer is formed substantially simultaneously with formation of the protective layer.

In another embodiment the crack preventive layer may be formed of the same material as the circuit patterns so that the crack preventive layer is formed substantially simultaneously with formation of the circuit patterns.

In yet another embodiment, the crack preventive layer may comprise a first crack preventive layer on the substrate that is formed of the same material as the circuit pattern and a second crack preventive layer on the first crack preventive layer that is formed of the same material as the protective layer. In this embodiment the first crack preventive layer may be formed substantially simultaneously with formation of the circuit patterns, and the second crack preventive layer may be formed substantially simultaneously with formation of the protective layer.

According to another aspect of the present invention, there is provided a method of manufacturing a printed circuit board for a semiconductor package, comprising: providing a base substrate; forming circuit patterns on a surface of the base substrate; forming a protective layer on the circuit patterns; forming a crack preventive layer along at least a portion of a rectangular area where a rectangular hole is to be formed in the base substrate; and removing base substrate from the rectangular area. The removing may be accomplished by a punching process.

According to yet another aspect, there is provided a method of manufacturing a semiconductor package comprising: providing a base substrate; forming circuit patterns on a surface of the base substrate; forming a protective layer on the circuit patterns; forming a crack preventive layer along at least a portion of a rectangular area where a rectangular hole is to be formed in the base substrate; removing base substrate from the rectangular area; seating a semiconductor chip on the base substrate over the rectangular hole; and packaging the semiconductor chip and the base substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

The present invention will now be described more fully with reference to the accompanying drawings in which exemplary embodiments of the invention are shown.

Figure 1:
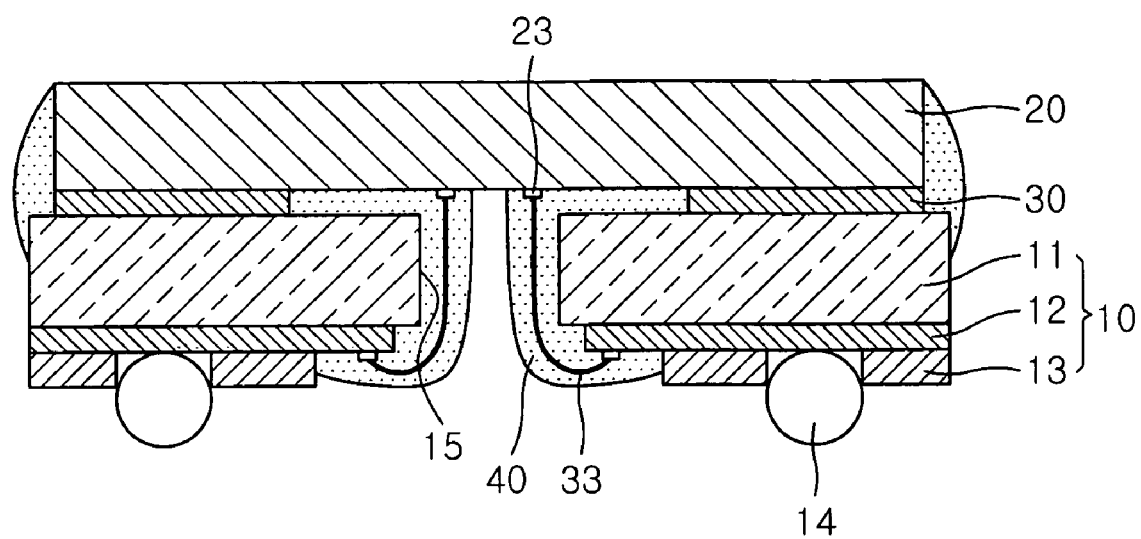
FIG. 1 is a cross-sectional view illustrating a conventional BOC package.
Figure 2:
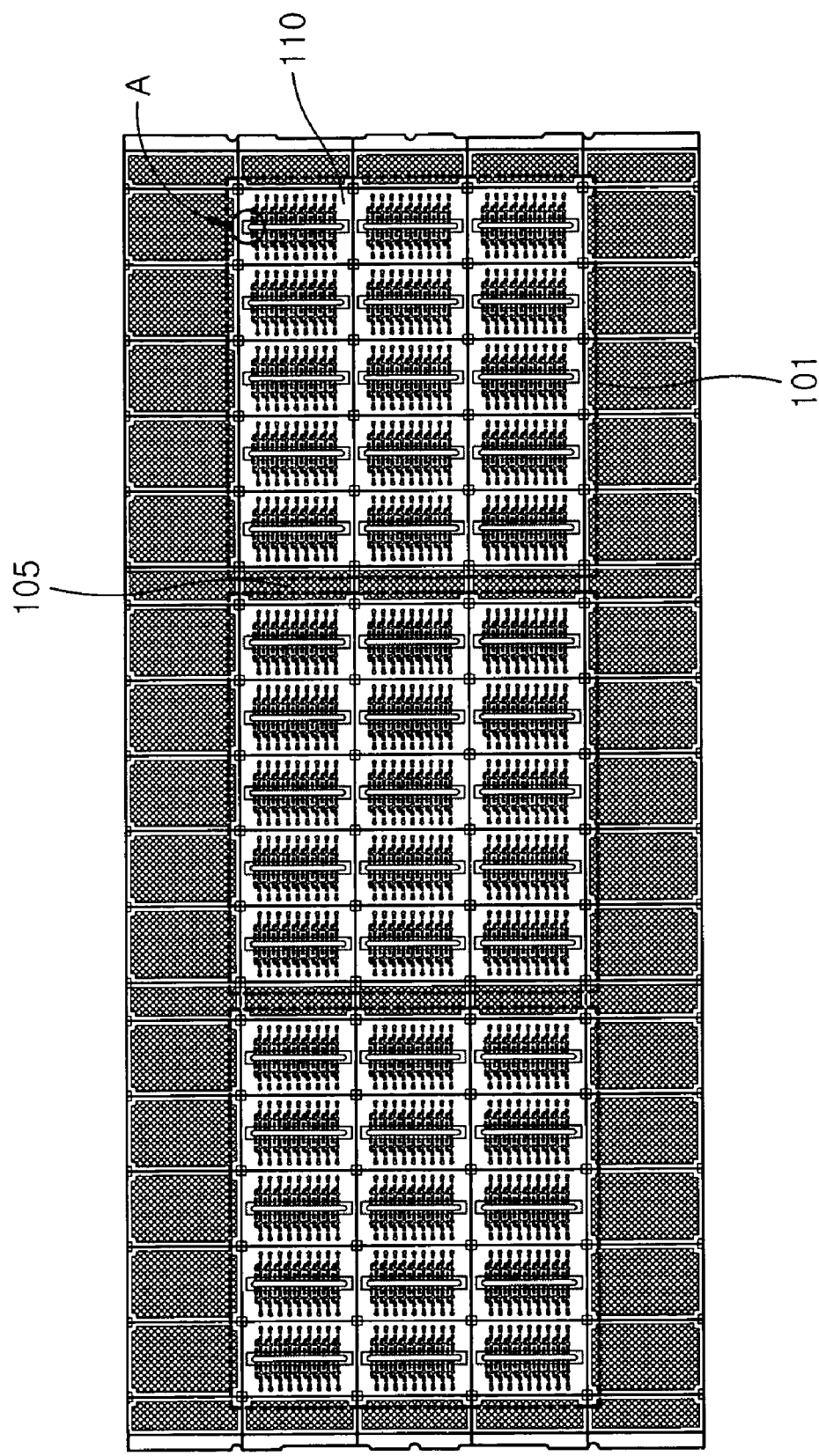
FIG. 2 is a plan view of a strip unit of example printed circuit boards according to an aspect of the present invention.

FIG. 2 is a plan view of a strip unit of printed circuit boards. Referring to FIG. 2, a plurality of printed circuit boards 110 constitutes one unit substrate 101 and a dummy pattern 105 between the unit substrates 101. The unit substrates 101 can be supplied by a reel-to-reel process.

Figure 3:
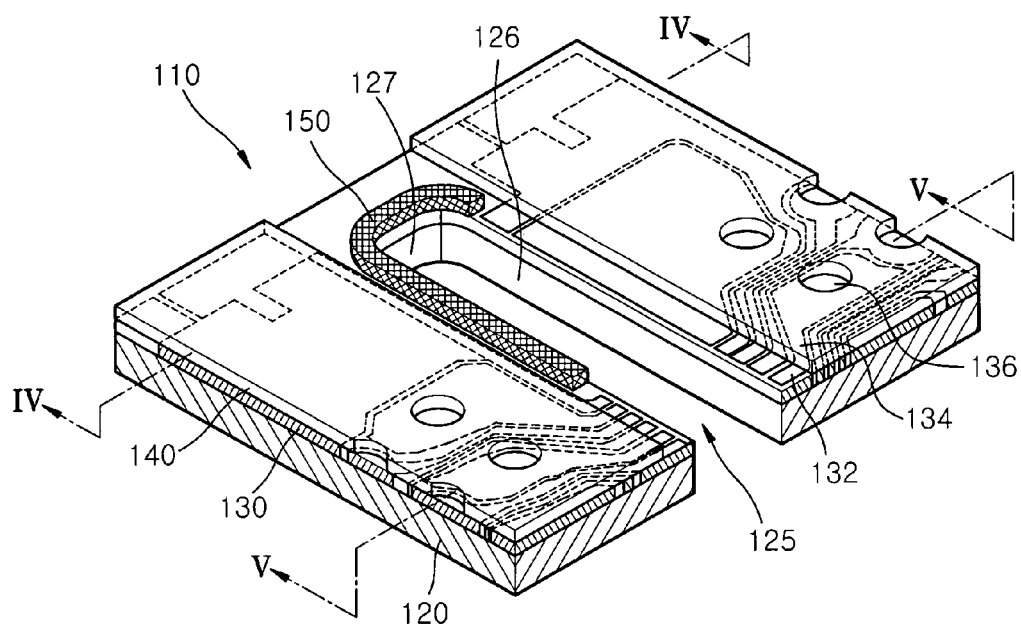
FIG. 3 is an enlarged perspective bottom view of portion A in FIG. 2.
Figure 4:
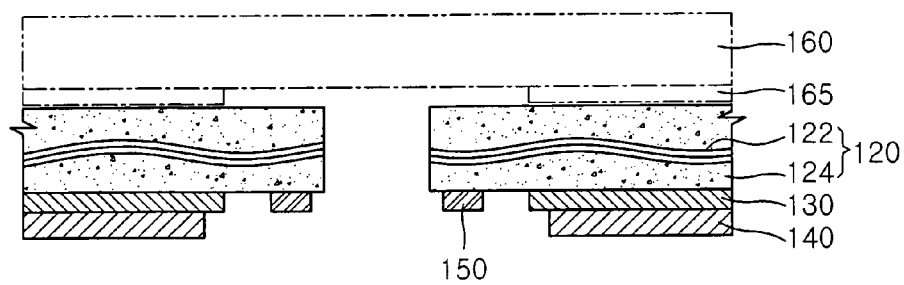
FIG. 4 is a cross-sectional view taken along line IV-IV of FIG. 3.
Figure 5:
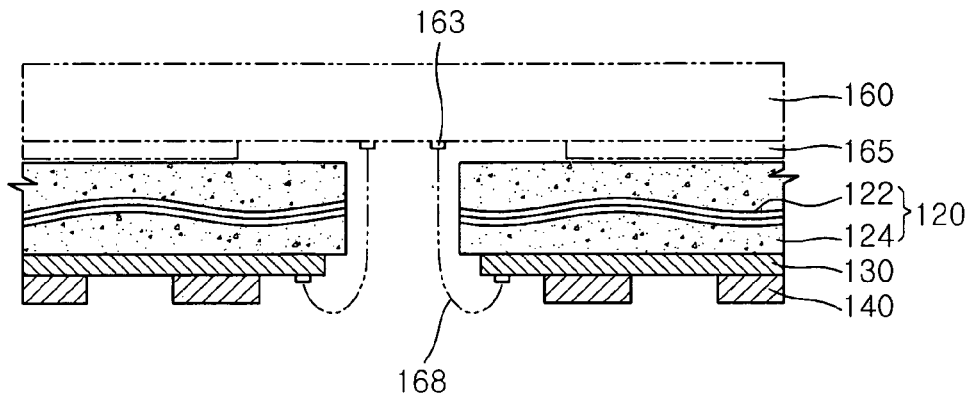
FIG. 5 is a cross-sectional view taken along line V-V of FIG. 3.

FIG. 3 is an enlarged perspective bottom view of portion A in FIG. 2. FIG. 4 is a cross-sectional view taken along line IV-IV of FIG. 3 and FIG. 5 is a cross-sectional view taken along line V-V of FIG. 3. Referring to FIGS. 3 through 5, the printed circuit board 110 includes a base substrate 120, circuit patterns 130, a protective layer 140, and a crack preventive member or layer 150.

Figure 9:
FIG. 9 is a cross-sectional view taken along line IX-IX of FIG. 8.

The base substrate 120 includes at least one rectangular hole 125. The base substrate 120 is usually formed of Bismaleimide Triazine (BT) or FR-4. As best illustrated in FIG. 9, the base substrate 120 may include a prepreg 122 and a resin material 124 formed around the prepreg 122. The prepreg 122 is a composite of a glass fiber and a resin. The prepreg 122 can include the resin material 124 with a content of about 70 wt % or less, can have a thickness of about 0.15 mm or less, and can have a strength greater than about 25 Gpa. This condition is one of the conditions that the base substrate 120 having the prepreg 122 and the resin material 124 can be supplied in the reel-to-reel method and can maintain the strength greater than a predetermined level. The strength of the base substrate 120 can be controlled by controlling the content of the resin material 124 for the prepreg 122.

The rectangular hole 125 can be a window slit. The window slit provides an aperture for connecting a semiconductor chip 160 that is configured on one surface of the substrate 120 with the circuit patterns that are configured on the other surface of the substrate 120. As shown in FIG. 5, a wire 168 connects an electrode unit 163 of the semiconductor chip 160 and an electrode connection unit 132 (FIGS. 3 and 6) of the printed circuit board 110 through the window slit. In FIG. 3, although the electrode connection units 132 are formed on a long-side end 126 of the window slit, the electrode connection units 132 may additionally or alternatively be formed on a short-side end 127 of the window slit.

The circuit patterns 130 are formed on at least one surface of the base substrate 120. As shown in FIG. 3, the circuit patterns 130 can include an electrode connection unit 132, a ball seating unit 136, and a connection unit 134. The electrode connection unit 132 is configured for connection to the electrode unit 163 of the semiconductor chip 160. The ball seating unit 136 is configured to receive a conductive ball for electrically connecting the circuit patterns and semiconductor chip 160 to an external substrate. The connection unit 134 connects the electrode connection unit 132 and the ball seating unit 136. The circuit patterns 130 can be patterned through exposing and developing a conductive film usually formed of copper on the base substrate 120, or by using other methods known in the art. In some embodiments, the circuit patterns 130 can be formed on an upper surface of the base substrate 120, and circuit patterns formed on upper and lower surfaces of the base substrate 120 can be connected to each other through a via hole.

In the printed circuit board 110 with the foregoing-described structure, the circuit patterns 130 are mainly formed on the lower surface of the base substrate 120. The printed circuit board 110 can be a substrate that is used in a BOC package in which the semiconductor chip 160 is flip chip bonded on the upper surface of the base substrate 120.

As shown in FIG. 4, the protective layer 140 is formed on the circuit patterns 130. The protective layer 140 protects the circuit patterns 130 from external contamination, and can be a solder resist (SR) or a photo solder resist. In this case, the protective layer 140 is configured on the circuit patterns 130 such that the protective layer 140 is not on the electrode connection unit 132, which is used to connect the electrode unit 163 of the semiconductor chip 160 with a bonding material and ball seating unit 136 where a conductive ball is seated. Also, the protective layer 140 is not formed around a perimeter of the rectangular hole 125. For example, if the rectangular hole 125 is a window slit, the protective layer 140 is not formed proximate to a perimeter of the slit because the electrode connection unit 132 is formed proximate to the perimeter of the slit so that a length of the wire 168 is relatively short. Accordingly, the protective layer 140 is not formed around a region that includes the electrode connection unit 132 of the window slit.

However, when the rectangular hole 125 is formed using a punching process, which has higher productivity than the drill processing, there is a high possibility of generating cracks around the rectangular hole 125, because the punching process can cause shear stress and fracture stress. Particularly, there is a further higher possibility of generating cracks in a region around the hole where the circuit patterns 130 are not formed, since crack formation in the region around the hole 125 lags in time from the region where the circuit patterns 130 are formed. In the present embodiment, the crack preventive layer 150 is formed around at least a portion of the perimeter of the rectangular hole 125 to prevent the generation of cracks around the rectangular hole 125. As shown in FIG. 3, the crack preventive member or layer 150 is configured to be generally J-shaped to extend around the sides 126, 127 and a vertex therebetween, but the crack preventive member or layer 150 may be configured otherwise.

The crack preventive layer 150 is formed along at least a portion of an edge of the rectangular hole 125 to prevent the concentration of shear and fracturing stresses on a region where the circuit patterns 130 are not formed. As shown in FIG. 4, the crack preventive layer 150 is formed on a surface of the substrate 120 between the hole 125 and the circuit patterns 130 such that an outer edge of the crack preventive layer 150 is separated from an inner edge of the circuit patterns 130.

The crack preventive layer 150 may be formed of the same material as the protective layer 140. In this case, the crack preventive layer 150 may be formed substantially simultaneously with a process for forming the protective layer 140, thereby simplifying a manufacturing process of the board 110. Alternatively, the crack preventive layer 150 may be formed of the same material as the circuit patterns 130. That is, the crack preventive layer 150 may comprise circuit patterns that do not electrically connect with the patterns 130 or the semiconductor chip 160. In this case, the generation of cracks can be avoided since the concentration of shear and fracturing stresses on one location can be prevented. A crack preventive layer 150 formed of the same material as the circuit patterns 130 can be formed substantially simultaneously with a process for forming the circuit patterns 130.

Figure 6:
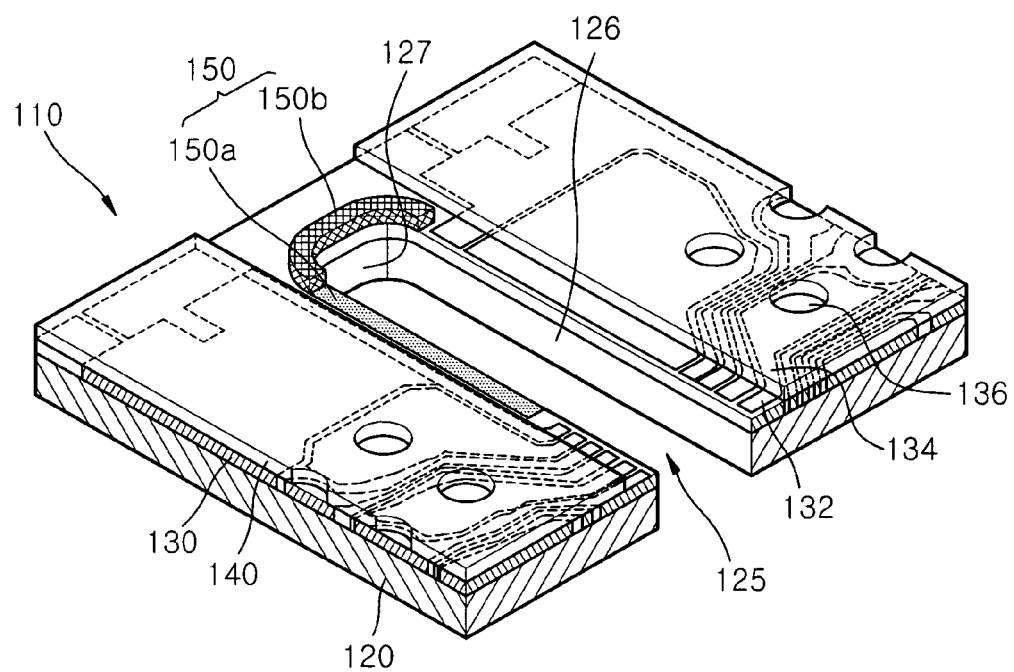
FIG. 6 is a modified perspective view of FIG. 3.

Referring to FIG. 6, the crack preventive layer 150 can include a first crack preventive layer 150a formed of the same material as the circuit patterns 130 and a second crack preventive layer 150b, which is on the first crack preventive layer 150a, formed of the same material as the protective layer 140.

Referring to FIGS. 3 and 6, the crack preventive layer 150 having a predetermined width can be formed along portions of one or more perimeter edges of the rectangular hole 125. In this case, the rectangular hole 125 includes the long-side ends 126 parallel to each other and a short-side end 127 that connects the long-side ends 126. The crack preventive layer 150 may be formed at least on an edge of the short-side end 127. This is because the shear stress usually concentrates on the short-side end 127 and a corner between the short-side end 127 and long-side ends 126 when a punching process is performed. Accordingly, the generation of cracks around the rectangular hole 125 can be prevented by forming the crack preventive layer 150 on the portions where the shear stress is known to be concentrated.

The base substrate 120 can be manufactured by using a reel-to-reel (roll-to-roll) process. Accordingly, to minimize a further processing time for forming a window slit, the rectangular hole 125 may be formed using a punching process.

Figure 7:
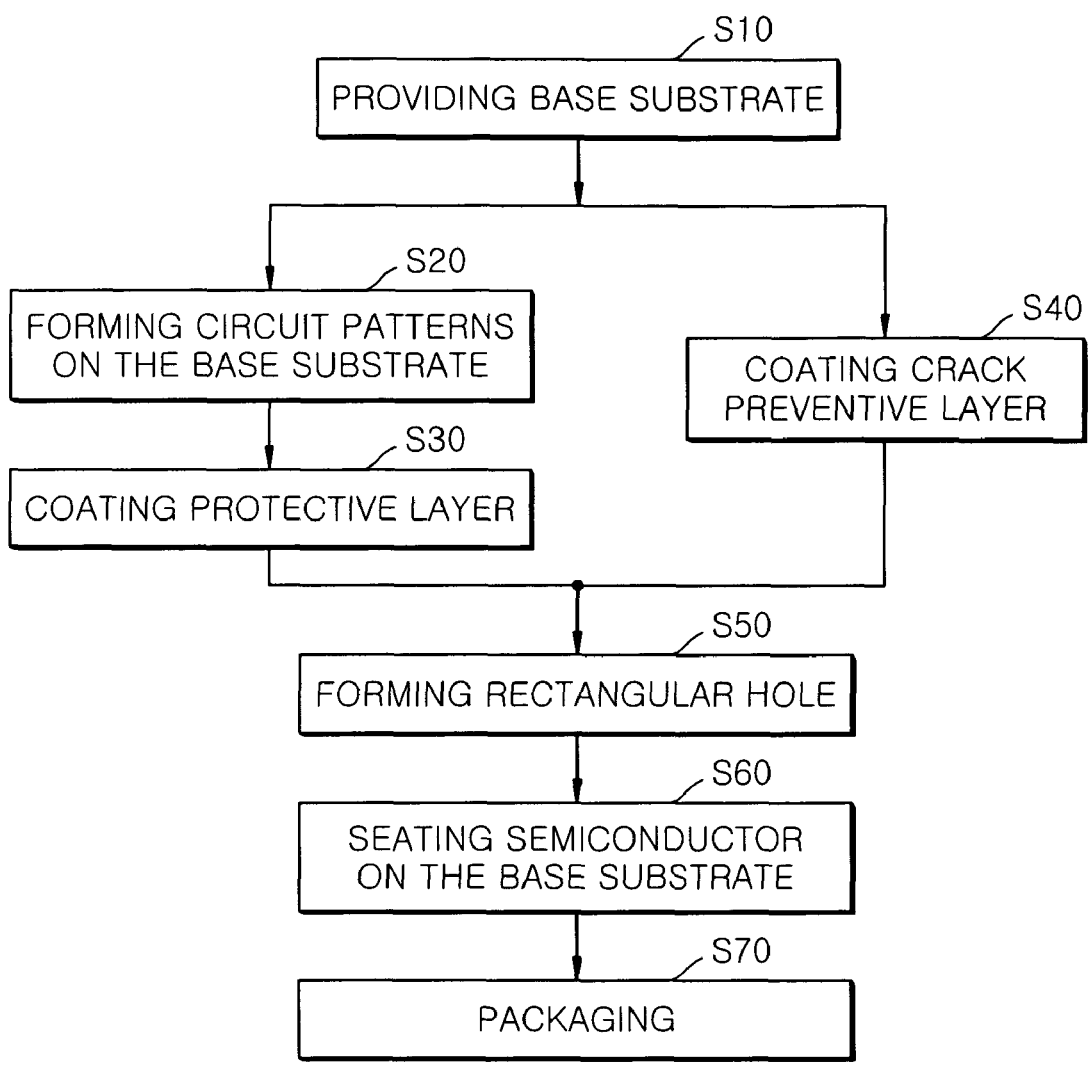
FIG. 7 is a flow chart of an example method of manufacturing a semiconductor package according to another aspect of the present invention.

FIG. 7 is a flow chart of an example method of manufacturing a semiconductor package according to another embodiment of the present invention. Referring to FIG. 7, the method includes: providing a base substrate (S10); forming circuit patterns on at least one surface of the base substrate (S20); forming a protective layer on the circuit patterns (S30); substantially simultaneously with steps S20 and S30, forming a crack preventive layer (S40) proximate to an area of the base substrate that is to be removed; forming a rectangular hole (S50) in the area (e.g., by punching a central portion of the base substrate); seating a semiconductor chip on the base substrate (S60); and packaging the semiconductor chip and the base substrate (S70).

Figure 8:
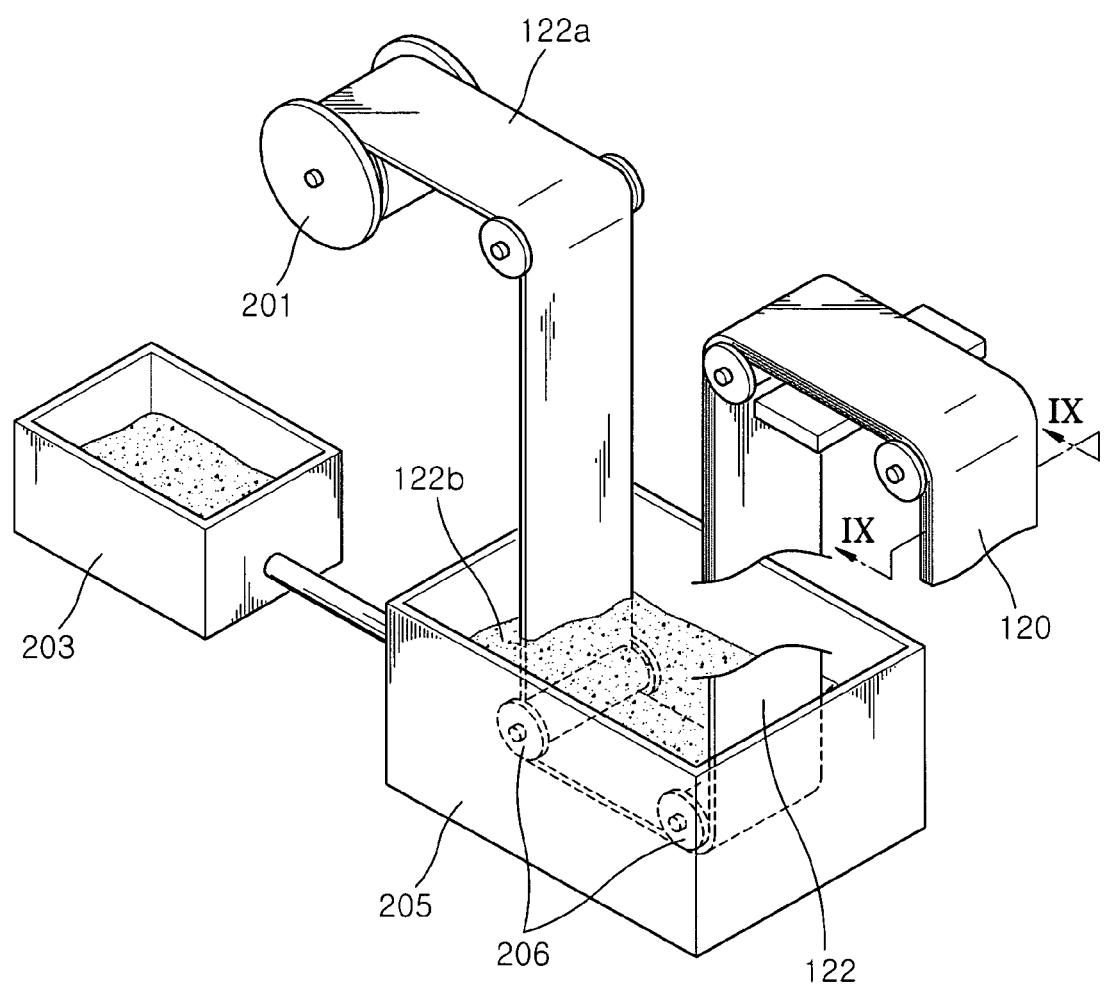
FIG. 8 is a perspective view showing steps for providing a base substrate.

A semiconductor package and method of manufacturing the same will now be described in detail with reference to FIGS. 8 through 13. Referring to FIGS. 8 and 9 (FIG. 9 illustrating a cross-sectional view taken along line IX-IX of FIG. 8), a base substrate 120 is provided. The base substrate 120 may include at least one layer of a prepreg 122, which is a composite of a glass fiber and a resin, and a resin material 124 formed around the prepreg 122. In the present embodiment, the prepreg 122 is preferably supplied in a reel-to-reel (roll-to-roll) process. For example, as shown in FIG. 8, a glass fiber 122a on a roll supply apparatus 201 is supplied to a resin tank 205 by a reel-to-reel method. A resin 122b supplied from a resin storage 203 is kept in a liquid state in the resin tank 205. Accordingly, the resin 122b is adhered on the glass fiber 122a as the fiber 122a is supplied to the resin tank 205. The glass fiber 122a with resin 122b adhered thereto may then be heated in an oven to form the substrate 120. Rollers 206 guide the transportation of the resin 122b and the substrate 120. Afterward, although not depicted, the manufacturing of the base substrate 120 is completed by covering the prepreg 122 with the resin material 124 (FIG. 9). The prepreg 122 can include the resin 122b with a content of 70 wt % or less, can have a thickness of at most 0.15 mm, and can have a strength greater than 25 Gpa. In this way, the base substrate 120 can be supplied by the reel-to-reel method and can maintain the strength greater than a predetermined level for processing in a subsequent process. The strength of the prepreg 122 can be controlled by controlling the content of the resin 122b that constitutes the prepreg 122 together with the glass fiber 122a.

The base substrate 120 can be formed of BT or FR-4. The FR-4 has high hygroscopic, high adhesiveness, high fire retardant, and high electrical insulative characteristics. The thermal coefficient of the base substrate 120 can be controlled by adjusting the content of a filler added to the resin 122b.

Figure 10:
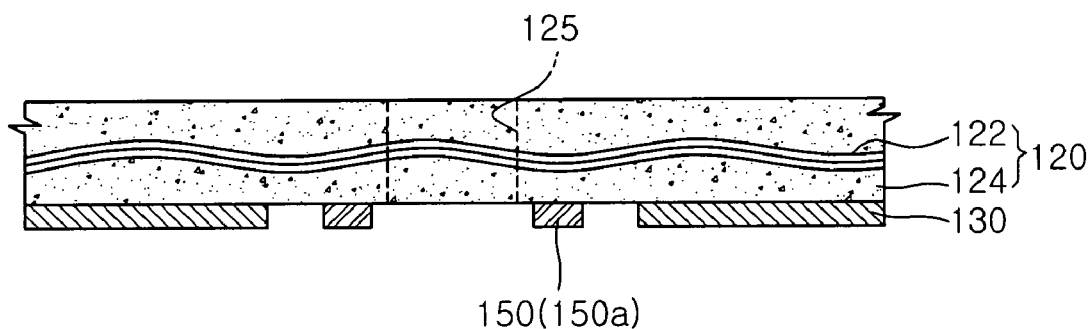
FIG. 10 is a cross-sectional view of forming a circuit pattern on a base substrate.

Afterward, as depicted in FIG. 10, the plurality of circuit patterns 130 is formed on at least one surface of the base substrate 120. For example, the patterns 130 may comprise a conductive film that is formed on at least one, surface the base substrate 120. Next, after coating a photosensitive film on an upper surface the conductive film, the circuit patterns 130 can be formed by exposing and developing (e.g., etching) the conductive film.

As depicted in FIG. 3, each of the circuit patterns 130 can include an electrode connection unit 132 connected to the electrode unit 163 of the semiconductor chip 160 on a lower surface of the base substrate 120. Furthermore the patterns 130 may include a ball seating unit 136 where a conductive ball electrically connected to an external substrate is seated, and a connection unit 134 that electrically connects the electrode connection unit 132 and the ball seating unit 136. In a subsequent process, which will be described later, the semiconductor chip 160 can be bonded on an upper surface of the base substrate 120 when the substrate 120 is turned upside down such that the patterns 130 are on the bottom surface.

Figure 11:
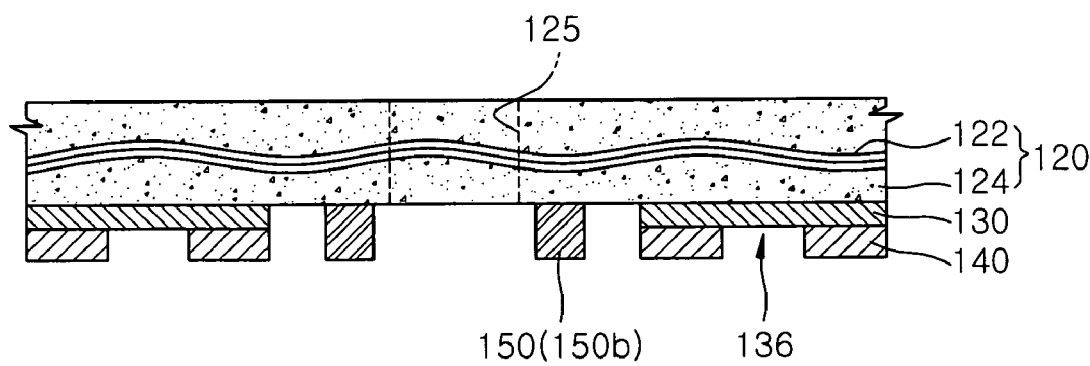
FIG. 11 is a cross-sectional view of forming a protective layer on a base substrate.

As depicted in FIG. 11, the protective layer 140 is formed on the base substrate 120, more particularly on the circuit patterns 130. If the base substrate 120 is manufactured by a reel-to-reel method, the content of the resin 122b in the base substrate 120 may be 70 wt % or less. The amount of the resin 122b can maintain the strength of the base substrate 120 to be supplied in the reel-to-reel process. That is, the protective layer 140 is easily bent since the thermal expansion coefficient thereof is approximately 60 ppm. Therefore, the base substrate 120 is required to have a strength that can prevent the bending of the protective layer 140. For this purpose, the content of the resin 122b in the base substrate 120 may be controlled to be 70 wt % or less.

Figure 12:
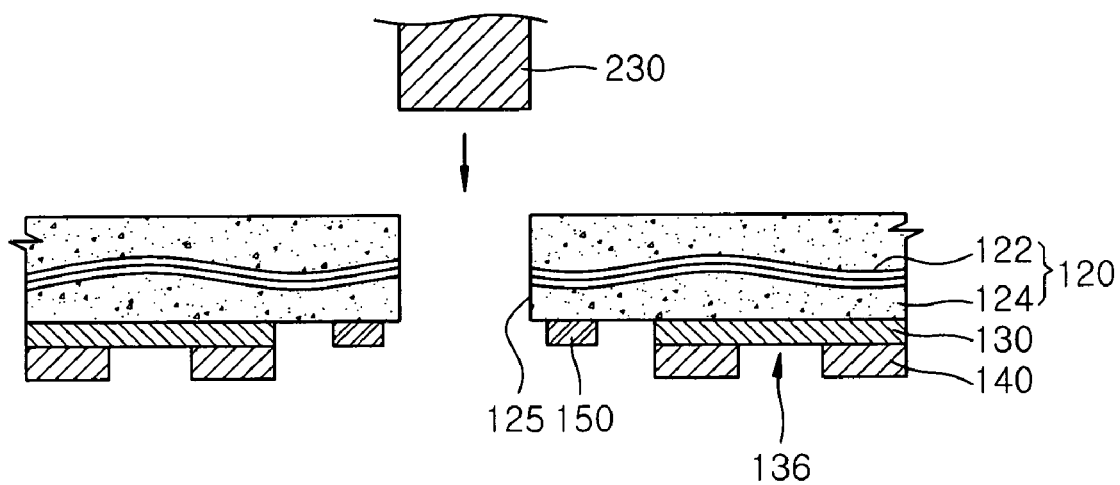
FIG. 12 is a cross-sectional view of forming a rectangular hole on a base substrate.
Figure 13:
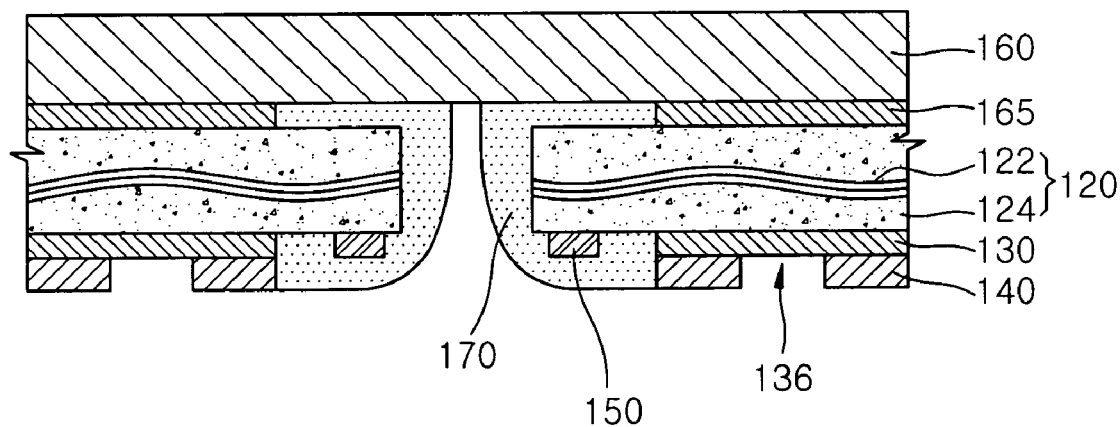
FIG. 13 is a cross-sectional view of packaging a base substrate and a semiconductor chip.

As depicted in FIG. 3, the protective layer 140 is not formed on the ball seating unit 136 and the electrode connection unit 132. Also, the protective layer 140 is not formed on a location where the rectangular hole 125 of the window slit, which corresponds to the semiconductor chip 160, is formed. In fact, as shown in FIGS. 11-13, it is preferred that an inner edge of the protective layer 140 not extend toward the hole 125 past an inner edge of the circuit patterns 130.

As depicted in FIGS. 10 and 11, the crack preventive layer 150 is formed along at least a portion of a rectangular area which is to be removed to form the hole 125. The crack preventive layer 150 provides a reinforcement/stress buffer/dampener on the substrate 120 that can prevent the generation of cracks due to the concentration of stress when the rectangular hole 125 is formed. Particularly, the crack preventive layer 150 may be formed around the short-side end 127 (FIGS. 3 and 6) of the rectangular hole 125.

As can be appreciated from FIG. 10, the crack preventive layer 150 may be formed of the material 150a as the circuit patterns 130, and can be formed substantially simultaneously with the circuit patterns 130. As can be appreciated from FIG. 11, the crack preventive layer 150 may be formed of the same material 150b as the protective layer 140, and may be formed substantially simultaneously with the protective layer 140. Additionally, as depicted in FIG. 5, the crack preventive layer 150 may include a first crack preventive layer 150a formed of the material as the circuit patterns 130 and a second crack preventive layer 150b formed of the same material as the protective layer 140. The first crack preventive layer 150a may be formed substantially simultaneously with the circuit patterns 130, and the second crack preventive layer 150b may be formed on the first crack preventive layer 150a substantially simultaneously with the protective layer 140.

The crack preventive layer 150 formed of the same materials as the circuit patterns 130 and the protective layer 140 can have an identical width to the portion where the rectangular hole 125 is formed. The crack preventive layer 150a formed of the same material as the circuit patterns 130 has the same stress resistance as the circuit patterns 130, and the crack preventive layer 150b formed of the same material as the protective layer 140 has the same stress resistance as the protective layer 140 so that generation of cracks is prevented when the rectangular hole 125 is formed by punch processing.

Referring to FIG. 12, the rectangular hole 125 is formed by punching a central portion of the base substrate 120 using a punching means 230. That is, the rectangular hole 125 is formed using the punching process, which has higher productivity than other methods, but the generation of cracks can be prevented by the already-configured crack preventive layer 150.

In particular, stresses can be concentrated around the short-side end 127 of the perimeter of the rectangular hole 125 when the rectangular hole 125 is formed by a punching process. However, cracks are not generated at the short-side end 127 of the rectangular hole 125 since the crack preventive layer 150 is formed on the short-side end 127.

In this case, the rectangular hole 125 can be a window slit.

Referring to FIG. 13, the semiconductor chip 160 and the base substrate 120 are packed/encapsulated or otherwise configured to provide a semiconductor package. In this case, the semiconductor chip 160 and the base substrate 120 can be bonded in a BOC structure. That is, the semiconductor chip 160 is bonded in a reversed position on an upper surface of the base substrate 120 while the electrode connection unit 132 and the ball seating unit 136 are formed on a lower surface thereof. In this case, an adhesive 165 can be disposed between the semiconductor chip 160 and the base substrate 120. The semiconductor chip 160 is configured on the base substrate 120 so that the electrode unit 163 is disposed in an inner space of the window slit. The electrode unit 163 of the semiconductor chip 160 and the electrode connection unit 132 of the base substrate 120 are bonded using a wire 168. Afterward, the resultant product including the wire 168 is molded using a molding material 170.

According to the present invention, a rectangular hole can be formed in a printed circuit board by performing a punching process, thereby reducing the manufacturing time, and preventing the generation of cracks around the rectangular hole, since a crack preventive layer is formed around the rectangular hole.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board comprising:
   a base substrate including a first surface, a second surface and at least one window slit having a perimeter;
   a plurality of circuit patterns on at least one of the first surface and the second surface of the base substrate;
   a protective layer formed on the plurality of circuit patterns; and
   a crack preventive layer on said at least one of the first surface and second surface of the base substrate, the crack preventive layer being separated from the plurality of circuit patterns and extending along at least a portion of the perimeter of the window slit.

2. The printed circuit board of claim 1, wherein the crack preventive layer comprises a material that is selected from the group consisting of solder resists and photo solder resists.

3. The printed circuit board of claim 2, wherein the material of the protective layer is selected from the group consisting of solder resists and photo solder resists.

4. The printed circuit board or claim 1, wherein the crack preventive layer comprises a conductive film material.

5. The printed circuit board of claim 1, wherein the perimeter of the window slit comprises two long sides that are parallel to each other and two short sides that connect adjacent ends of the two long sides, and wherein the crack preventive layer extends along at least one of the two short sides.

6. A printed circuit board comprising:
   a base substrate including a first surface, a second surface and at least one window slit having a perimeter;
   a plurality of circuit patterns on at least one of the first surface and the second surface of the base substrate;
   a protective layer formed on the plurality of circuit patterns; and
   a crack preventive layer on said at least one of the first surface and second surface of the base substrate, the crack preventive layer being separated from the plurality of circuit patterns and extending along at least a portion of the perimeter of the window slit;
   wherein the crack preventive layer comprises:
   a first crack preventive layer on said at least one of the first surface and second surface of the base substrate, the first crack preventive layer consisting essentially of a material of the plurality of circuit patterns; and
   a second crack preventive layer on the first crack preventive layer, the second crack preventive layer consisting essentially of a material of the protective layer.

* * * * *